US009594860B2

(12) United States Patent
Anand et al.

(10) Patent No.: US 9,594,860 B2
(45) Date of Patent: Mar. 14, 2017

(54) ANALOG MIXED SIGNAL MODEL EQUIVALENCE CHECKING (71) Applicants: Himyanshu Anand, Cedar Park, TX (US); Magdy S. Abadir, Austin, TX (US)

(72) Inventors: Himyanshu Anand, Cedar Park, TX (US); Magdy S. Abadir, Austin, TX (US)

(73) Assignee: NXP USA, INC., Austin, TX (US)

( * ) Notice: Subject to any disclaimer, the term of this patent is extended or adjusted under 35 U.S.C. 154(b) by 755 days.

(21) Appl. No.: 14/134,488

(22) Filed: Dec. 19, 2013

(65) Prior Publication Data
US 2015/0178428 A1    Jun. 25, 2015

(51) Int. Cl.
G06F 17/50    (2006.01)
(52) U.S. Cl.
CPC ................. G06F 17/5036 (2013.01)
(58) Field of Classification Search
USPC .................. 703/2, 14; 716/101, 104, 106
See application file for complete search history.

(56) References Cited

U.S. PATENT DOCUMENTS

| | | | |
|---|---|---|---|
| 6,378,112 B1 | 4/2002 | Martin et al. | |
| 8,117,576 B2* | 2/2012 | Mossawir | G06F 17/504 716/101 |
| 8,682,631 B2* | 3/2014 | Chang | G06F 17/5036 703/13 |
| 9,032,347 B1* | 5/2015 | O'Riordan | G06F 17/5022 716/104 |
| 9,147,026 B2* | 9/2015 | Krasnicki | G06F 17/5036 |
| 2002/0022950 A1* | 2/2002 | Ballam | G06F 17/5022 703/14 |
| 2009/0228849 A1* | 9/2009 | Mossawir | G06F 17/504 716/106 |

OTHER PUBLICATIONS

Balivada et al., "Verification of transient response of linear analog circuits," Proceedings of the 13th IEEE VLSI Test Symposium, Princeton, NJ, Apr. 1995, pp. 42-27.

(Continued)

Primary Examiner — Thai Phan (57) ABSTRACT

An approach is provided in which a hybrid mixed signal equivalence checking system partitions a mixed signal reference model and a mixed signal model under verification into analog sections and digital sections. The hybrid mixed signal equivalence checking system simulates the analog sections from the two different models to determine analog equivalence. As such, the hybrid mixed signal equivalence checking system verifies digital equivalence between the digital reference section and the digital section model under verification in response to evaluating one or more difference functions that represent at least a portion of the first digital section and the second digital section. As a result, the hybrid mixed signal equivalence checking system verifies equivalence between the mixed signal reference model and the mixed signal model under verification based upon the verified analog equivalence and the verified digital equivalence.

20 Claims, 8 Drawing Sheets (56) References Cited

OTHER PUBLICATIONS

Hedrich et al., "A Formal Approach to Nonlinear Analog Circuit Verification," Digest of Technical Papers, 1995 IEEE/ACM International Conference on Computer-Aided Design, San Jose, CA, Nov. 1995, 5 pages.

Hedrich et al., "A formal approach to verification of linear analog circuits with parameter tolerances," Proceedings of the conference on Design, Automation, and Test in Europe, Paris, France, Feb. 1998, 6 pages.

Salem et al., "Semi-formal verification of VHDL-AMS descriptions," 2002 IEEE International Symposium on Circuits and Systems, Phoenix-Scottsdale, Arizona, May 2002, pp. V-333-V336.

\* cited by examiner

ANALOG MIXED SIGNAL MODEL EQUIVALENCE CHECKING

TECHNICAL FIELD

The present disclosure relates to checking equivalence between a mixed signal reference model and a mixed signal model under verification. More particularly, the present disclosure relates to using analog assertions and difference functions to verify analog mixed signal model equivalence.

BACKGROUND

Mixed signal designs include an analog design section and a digital design section, and are typically targeted for a specific purpose and function. Due to a mixed signal design's complex nature, a mixed signal design typically requires a high level of expertise and careful use of design verification tools, which start at design description and continue through various abstraction levels until reaching device fabrication.

Mixed signal design verification presents unique challenges. Systematic design methodologies in the analog and mixed-signal arena are typically more primitive than digital design methodologies. As such, analog circuit design and verification automation is not available to the same extent as existing digital circuit design and verification automation.

In addition, combining analog designs with digital designs adds additional complexities and challenges. Analog mixed signal designs are typically verified using SPICE simulations and visual inspections of two or more models to verify equivalence. As such, analog mixed signal verification techniques are typically error prone and inadequate, especially in the area of detecting bugs due to discrepancies between a reference model (e.g. an RTL model) and a model under verification (e.g. schematic/transistor level model).

BRIEF DESCRIPTION OF THE SEVERAL VIEWS OF THE DRAWINGS

The present disclosure may be better understood, and its numerous objects, features, and advantages made apparent to those skilled in the art by referencing the accompanying drawings, wherein.

DETAILED DESCRIPTION

This disclosure describes a hybrid mixed signal equivalence checking system that verifies equivalence between a mixed signal reference model and a mixed signal model under verification. The hybrid mixed signal equivalence checking system retrieves a mixed signal reference model and a mixed signal model under verification that both correspond to an analog mixed signal circuit design. The mixed signal model under verification, in one embodiment, is at a lower-level abstraction than the mixed signal reference model. For example, the mixed signal model under verification may be a transistor level model and the mixed signal reference model may be an RTL (register-transfer level) model.

The hybrid mixed signal equivalence checking system locates a first set of interface cut points that partitions the reference model into an analog section reference model and a digital section reference model. Likewise, the hybrid mixed signal equivalence checking system locates a second set of interface cut points that partitions the mixed signal model under verification into an analog section model under verification and a digital section model under verification.

As such, the hybrid mixed signal equivalence checking system verifies analog equivalence during analog simulation between the two analog sections (included in the reference model and the model under verification) by applying analog assertions and matching a first set of digitized analog output values at the first set of interface cut points to a second set of digitized analog output values at the second set of interface cut points. In turn, the hybrid mixed signal equivalence checking system verifies digital equivalence between the digital reference section and the digital section model under verification by evaluating one or more difference functions that are based upon the first digital section and the second digital section. In one embodiment, a first Boolean function may be generated that represents the first digital section and a second Boolean function may be generated that represents the second digital section. In this embodiment, a difference function is an exclusive-OR (XOR) of the first Boolean function and the second Boolean function (Diff(f1,f2)=f1^f2, where ^ is an XOR function).

As a result, the hybrid mixed signal equivalence checking system determines equivalence between the mixed signal reference model and the mixed signal model under verification based upon the analog equivalence verification and the digital equivalence verification.

Figure 1:
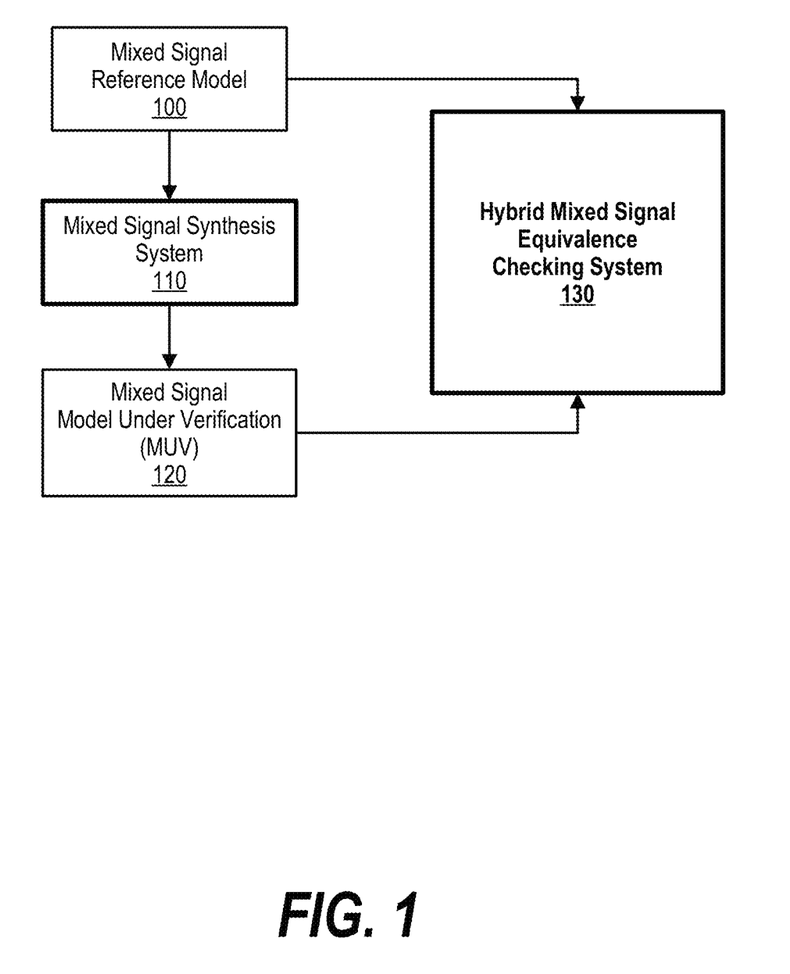
FIG. 1 is a high-level diagram depicting one example of a hybrid mixed signal equivalence checking system that checks equivalence between a mixed signal reference model and a mixed signal model under verification.

FIG. 1 is a high-level diagram depicting one example of a hybrid mixed signal equivalence checking system that checks equivalence between a mixed signal reference model and a mixed signal model under verification. Mixed signal reference model 100 may be, for example, a register-transfer level (RTL) representation of an analog mixed signal design that includes an analog section and a digital section. Mixed signal synthesis system 110 synthesizes mixed signal reference model 100 into mixed signal model under verification (MUV) 120, which may result in a schematic/transistor level model. As those skilled in the art can appreciate, mixed signal reference model 100 and mixed signal model under verification 120 may be at different abstraction levels than those discussed above. In addition, those skilled in the art would understand that mixed signal synthesis system 110 may be an automated synthesis tool or a combination of manually generated/automatically synthesized code.

Hybrid mixed signal equivalence checking system 130 performs a "hybrid" form of equivalence checking to verify equivalence between mixed signal model under verification 120 and mixed signal reference model 100. Hybrid mixed signal equivalence checking system 130 partitions both models 100 and 120 into their respective analog sections and digital sections, and may add additional analog/digital (A/D) converters in places to establish A/D "interface cut points," which identify a clear transition from analog outputs to digital inputs (see FIG. 2 and corresponding text for further details).

Hybrid mixed signal equivalence checking system 130 then simulates the analog models of mixed signal reference model 100 and mixed signal model under verification 120 to check for analog equivalence by comparing digitized analog output values produced at the interface cut points. When the analog models produce equivalent output values at their respective interface cut points, hybrid mixed signal equivalence checking system 130 performs formal digital equivalence checking on the digital models of mixed signal reference model 100 and mixed signal model under verification 120 by generating difference functions based upon the digital models (discussed below). If the difference functions produce a digital equivalence result that reduces to zero during verification, hybrid mixed signal equivalence checking system 130 determines digital equivalence between the digital models and, in turn, determines overall model equivalence (see FIG. 2 and corresponding text for further details).

Figure 2:
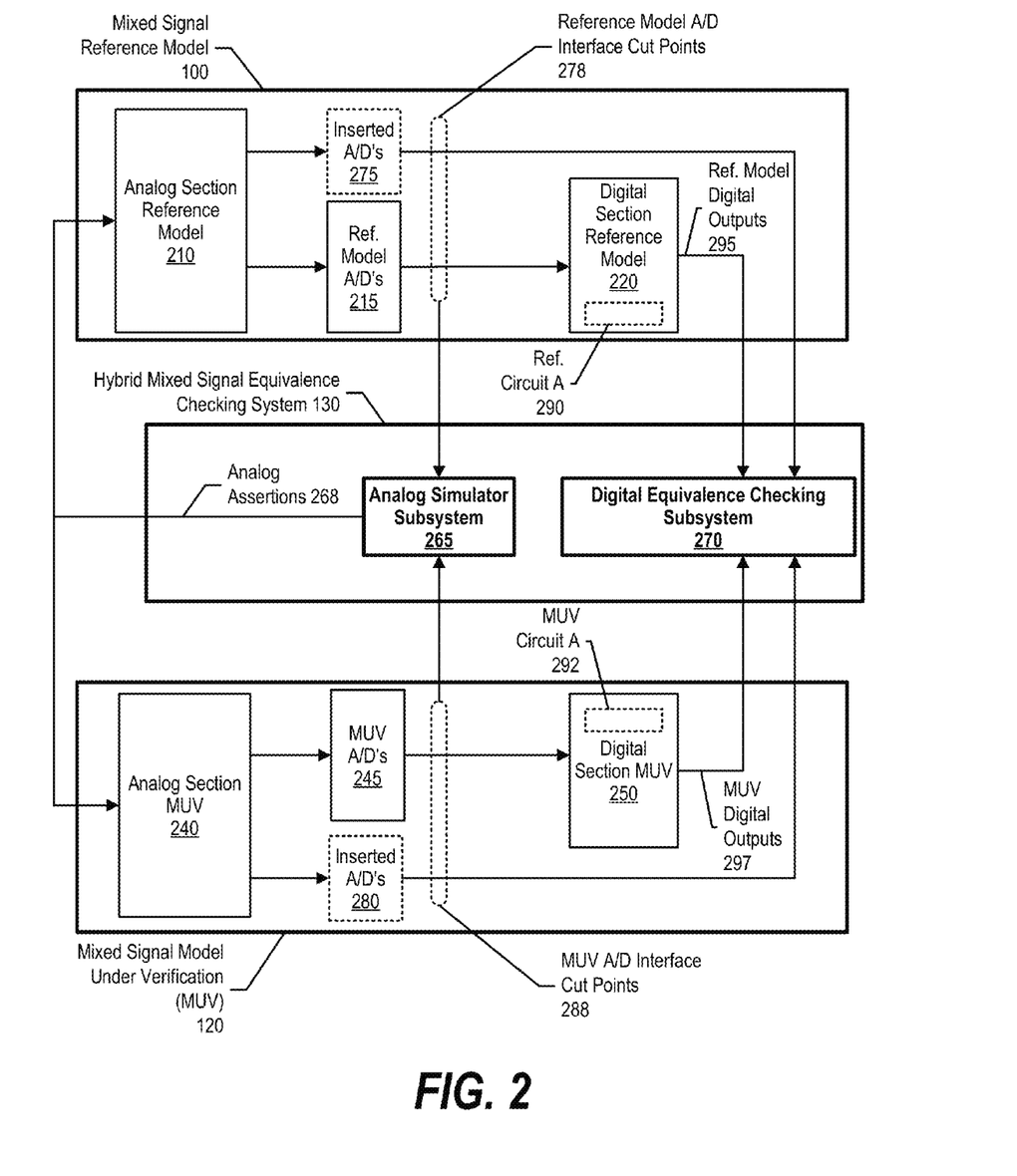
FIG. 2 is a detailed diagram depicting one example of a hybrid mixed signal equivalence checking system that checks equivalence between a mixed signal reference model and a mixed signal model under verification.

FIG. 2 is a detailed diagram depicting one example of a hybrid mixed signal equivalence checking system that checks equivalence between a mixed signal reference model and a mixed signal model under verification. In one embodiment, hybrid mixed signal equivalence checking system 130 includes processor(s) and/or equivalence checking circuitry (e.g., for high-speed simulations) to check equivalence between mixed signal reference model 100 and mixed signal model under verification 120. Hybrid mixed signal equivalence checking system 130 partitions mixed signal reference model 100 into analog section reference model 210 and digital section reference model 220 by identifying analog/digital converters 215 in mixed signal reference model 100 that converts analog signals to digital signals. Likewise, hybrid mixed signal equivalence checking system 130 partitions mixed signal model under verification 120 into analog section model under verification 240 and digital section model under verification 250 by identifying analog/digital converters 245 in mixed signal model under verification 120 that converts analog signals to digital signals.

In addition, hybrid mixed signal equivalence checking system 130 analyzes each mixed signal model and determines whether analog outputs exist that are not digitized by an existing A/D converter, such as analog outputs that provide an external analog output value (e.g., an audio signal). When hybrid mixed signal equivalence checking system 130 identifies such analog outputs, hybrid mixed signal equivalence checking system 130 inserts temporary A/D converters to establish clear A/D interface cut points. FIG. 2 shows the inserted A/D converters as inserted A/D's 275 and 280. As can be seen, interface cut points 278 and 288 include outputs from the A/D's within the mixed signal models (A/D's 215 and 245) as well as outputs from the A/D's inserted into the mixed signal models (A/D's 275 and 280).

Hybrid mixed signal equivalence checking system 130 includes analog simulator subsystem 265, which may include a processor and/or other equivalence checking circuitry to simulate and analyze analog sections of mixed signal reference model 100 and mixed signal model under verification 120. Analog simulator subsystem 265 begins analog simulation via by applying analog assertions 268 into analog section reference model 210 and analog section model under verification 240. Analog simulator subsystem 265, in turn, compares digitized analog output values residing on interface cut points 270 with digitized analog output values residing on interface cut points 288.

Figure 6:
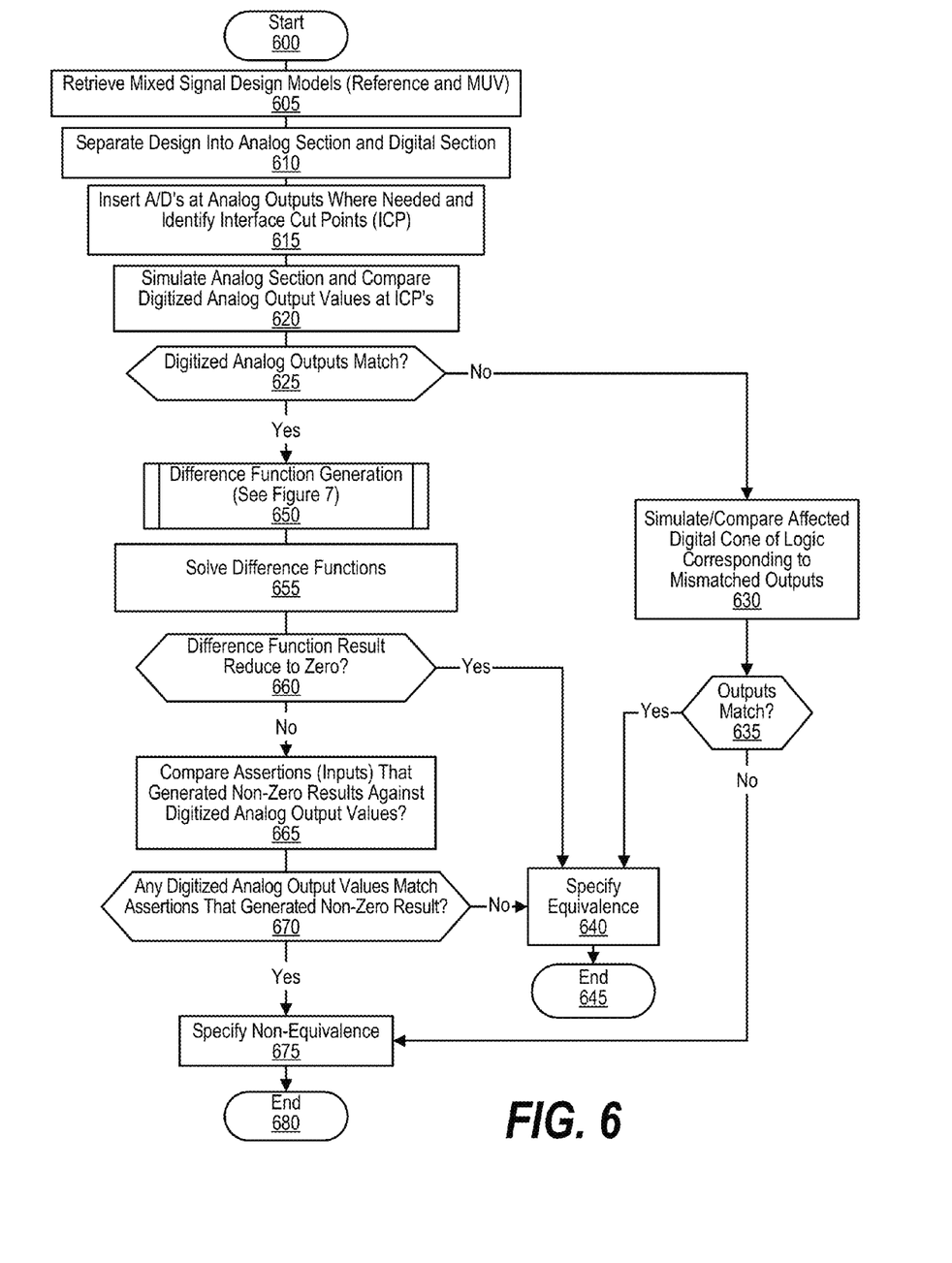
FIG. 6 is a flowchart depicting one example of steps taken to verify equivalence between a mixed signal reference model and a mixed signal model under verification.

If the interface cut point values do not match, hybrid mixed signal equivalence checking system 130 compares an affected digital cone of logic corresponding to the mismatched outputs through simulation to determine model equivalence (see 630 in FIG. 6 for more details). When the interface cut point values match between cut points 278 and cut points 288, hybrid mixed signal equivalence checking system 130 determines analog equivalence between analog models 210 and 240, and proceeds to verify digital equivalence between the digital design models of mixed signal reference model 100 and mixed signal model under verification 120 via digital equivalence checking subsystem 270 (discussed below).

Digital equivalence checking subsystem 270, which may include a processor and/or other equivalence checking circuitry to simulate and analyze digital sections of mixed signal reference model 100 and mixed signal model under verification 120. Digital equivalence checking subsystem 270 begins equivalence checking by creating miter circuits (XOR gates) that compare outputs 295 of digital section reference model 220 to corresponding outputs 297 of digital section model under verification 250 (as well as digitized analog output values from inserted A/D's 275 and 280) (see FIGS. 3, 4, and corresponding text for further details). For example, digital equivalence checking subsystem 270 connects the output of reference circuit A 290 included in digital section reference model 220 to one input of an XOR gate, and connects the output of corresponding model under verification circuit A 292 included in digital section model under verification 250 to the other input of the XOR gate. Digital equivalence checking subsystem 270 then reduces the miter circuits canonically in terms of the corresponding digital outputs and digital inputs at the A/D interface cut points (see FIG. 7 and corresponding text for further details). In turn, digital equivalence checking subsystem 270 generates difference functions based upon the reduced canonical circuit representations.

In one embodiment, digital equivalence checking subsystem 270 uses "satisfiability" (SAT) techniques to build the difference functions and solve the difference functions. As those skilled in the art can appreciate, SAT is an approach that determines whether an interpretation exists that satisfies a given Boolean formula. In other words, SAT establishes whether the variables of a given Boolean formula can be assigned in such a way as to make the formula evaluate to "TRUE" (e.g., to a value of 1). In another embodiment, binary decision diagrams (BDD's) may be used for SAT that, as those skilled in the art can appreciate, are data structures that represents a Boolean function. On a more abstract level, BDDs may be considered a compressed representation of sets or relations corresponding to circuitry included in digital section reference model 220 and digital section model under verification 250.

Digital equivalence checking subsystem 270 solves the difference functions (via SAT/BDD) to determine if each of the difference functions produces a digital equivalence result that reduces to zero, thus indicating that the corresponding digital models are equivalent. If each of the difference functions produces a digital equivalence result that reduces to zero, hybrid mixed signal equivalence checking system 130 determines that digital section reference model 220 is equivalent to digital section model under verification 250 and, in turn, generates a notification that mixed signal model under verification 120 is equivalent to mixed signal reference model 100 (because analog section reference model 210 is also equivalent to analog section model under verification 240 as discussed above).

Figure 5:
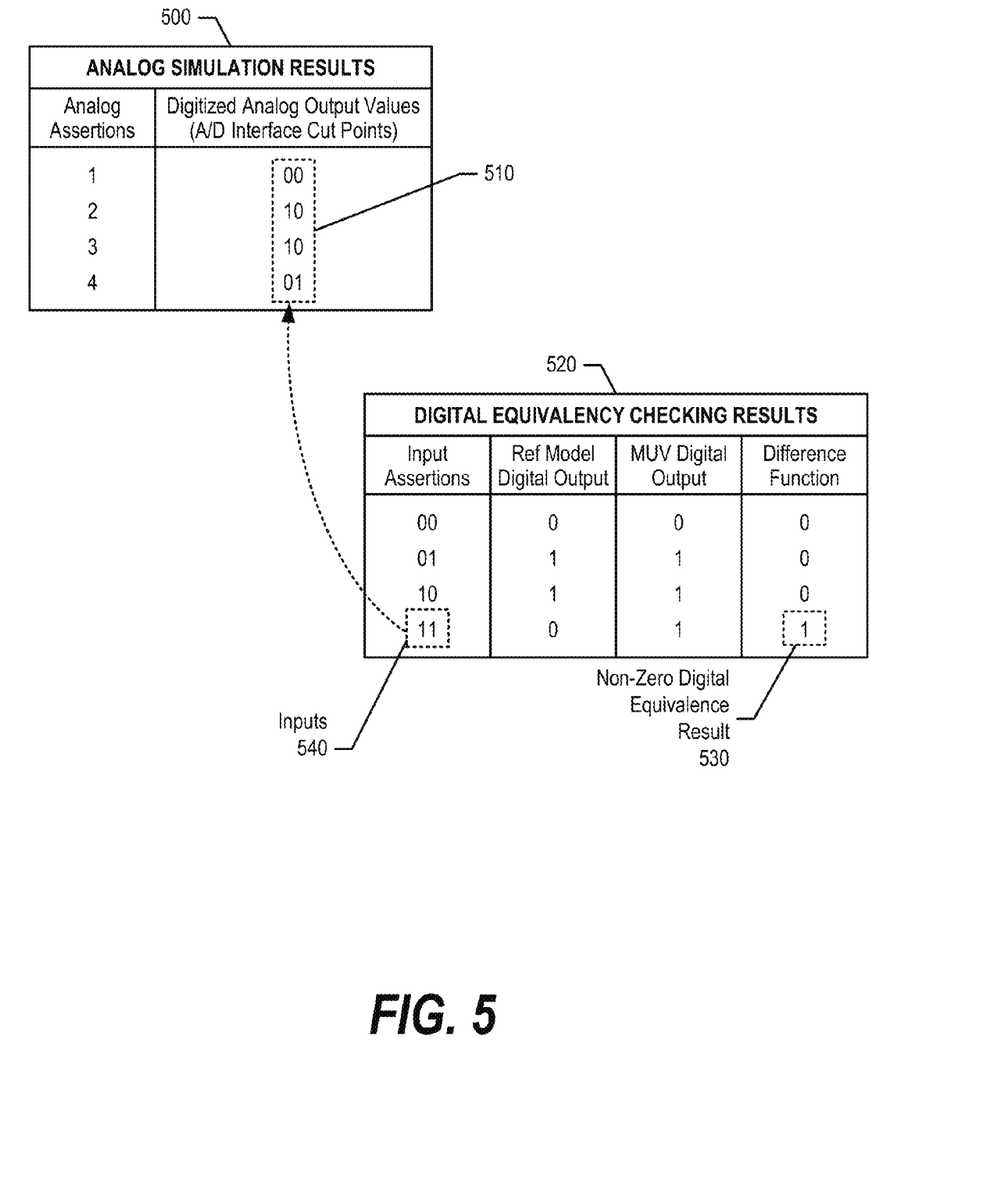
FIG. 5 is a diagram depicting one example of a hybrid mixed signal equivalence checking system analyzing analog simulation results to verify equivalence between two models when a difference function's digital equivalence result does not reduce to zero.

When one (or more) of the difference functions produce a digital equivalence result that does not reduce to zero, hybrid mixed signal equivalence checking system 130 determines which digital inputs (non-reducing input values) from the outputs of interface cut points 278 and 288 cause the digital equivalence result to be true (equaling 1 and signifying a difference between circuit comparisons, see FIG. 5 and corresponding text for further details). For example, an input of "10" into digital section reference model 220 and digital section model under verification 250 may cause outputs of digital section reference model 220 and digital section model under verification 250 to be different (XOR value=1).

Hybrid mixed signal equivalence checking system 130 then checks whether the non-reducing input values may actually be generated by analog models 210 and 240 by checking the digitized analog output values generated during the analog simulation phase (discussed above). If the digitized analog output values do not generate the non-reducing digital inputs that cause the non-reduction of the difference function (e.g., do not generate "10" as discussed above), hybrid mixed signal equivalence checking system 130 determines that mixed signal model under verification 120 is equivalent to mixed signal reference model 100 (see FIG. 6 and corresponding text for further details).

In one embodiment, hybrid mixed signal equivalence checking system 130 informs a circuit developer of the mixed signal model equivalence by generating an equivalence notification report that indicates the result of the equivalence checking. In this embodiment, in the case of equivalence, mixed signal equivalence checking system 130 generates a notification that the circuits are equivalent. However, in the case of non-equivalence, mixed signal equivalence checking system 130 may generate a counter-example trace using the difference functions (calculated earlier) to highlight parts of the design (models) that are different. In another embodiment, mixed signal equivalence checking system 130 identifies the differences by following the non-equivalent paths and assigning values to signals such that the output of the XOR miter circuit evaluates to true.

In another embodiment, hybrid mixed signal equivalence checking system 130 may be used to check equivalence between digital to analog mixed signal models (as opposed to checking equivalence between analog to digital mixed signal models). In this embodiment, hybrid mixed signal equivalence checking system 130 inserts temporary digital to analog converters at places where digital outputs are not converted to an analog signal (do not pass through a D/A converter). Continuing with this embodiment, hybrid mixed signal equivalence checking system 130 generates and solves difference functions for the digital models to determine digital equivalency as discussed above, and simulates the analog models as discussed above to determine analog equivalency.

As those skilled in the art can appreciate, information handling system 800 (shown in FIG. 8) may also be utilized to perform functions by hybrid mixed signal equivalence checking system 130. For example, processing steps may be performed by processors 810 and model information may be stored in internal hard drive 885, system memory 820, and/or USB devices 842.

Figure 3:
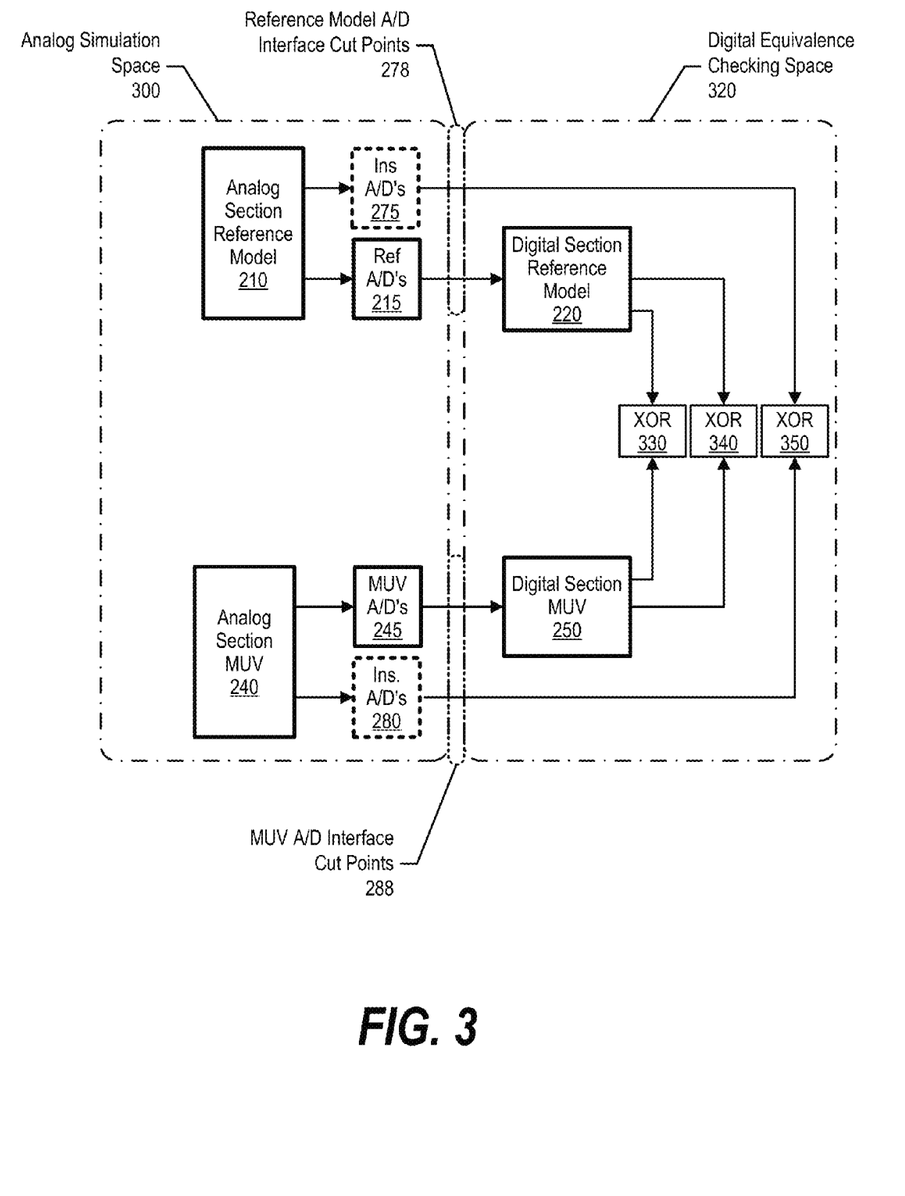
FIG. 3 is a diagram depicting one example of separating mixed signal models into an analog simulation space and a digital equivalence checking space.

FIG. 3 is a diagram depicting one example of separating mixed signal models into an analog simulation space and a digital equivalence checking space. FIG. 3 shows analog simulation space 300 and digital equivalence checking space 320, which are separated by interface cut points 278 and 288. As discussed previously, hybrid mixed signal equivalence checking system 130 temporarily inserts A/D converters 275 and 280 into mixed signal reference model 100 and mixed signal model under verification 120 where needed in order to establish a separation between analog simulation space 300 and digital equivalence checking space 320.

Hybrid mixed signal equivalence checking system 130 adds miter circuits (shown as XOR 330, 340, and 350) to digital equivalence checking space 320 to compare the outputs of digital section reference model 220 to the outputs of digital section model under verification 250, as well as compare the outputs of inserted A/D converters 275 to the outputs of inserted A/D converters 280. In turn, hybrid mixed signal equivalence checking system 130 generates and solves difference functions for digital equivalence checking space 320 using, for example, binary decision diagrams (see FIG. 7 and corresponding text for further details). As discussed in more detail below and shown in FIG. 6, the digital equivalence results of the difference functions (e.g., outputs of XOR gates) are utilized in the determination of overall digital equivalence.

Figure 4:
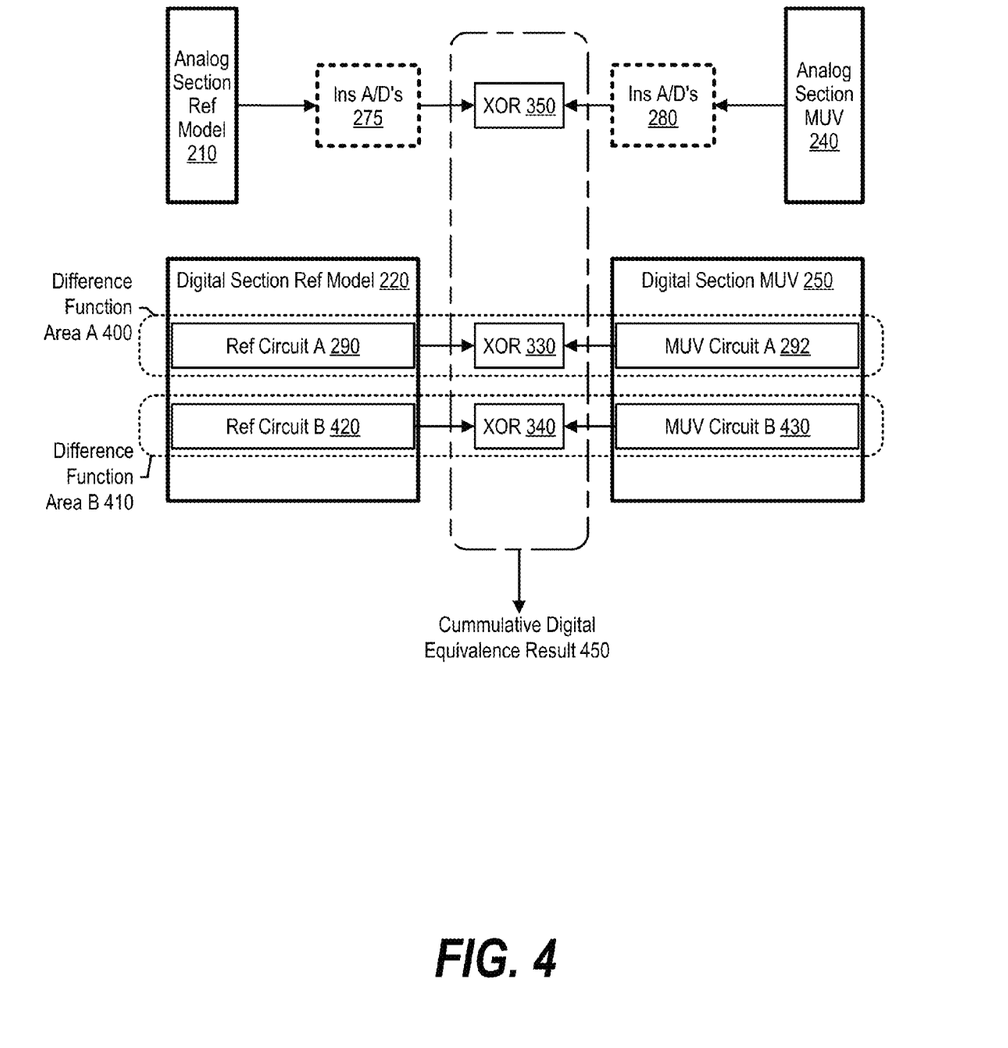
FIG. 4 is a diagram showing one example of using difference functions to partition the digital equivalence checking space.

FIG. 4 is a diagram showing one example of using difference functions to partition the digital equivalence checking space. FIG. 4 shows difference function area A 400, which includes reference circuit A 290 and model under verification circuit A 292 shown in FIG. 2, as well as XOR 330 shown in FIG. 3. As those skilled in the art can appreciate, the output of XOR 330 (digital equivalence result) will be "0" when the output of reference circuit A 290 is equal to the output of model under verification circuit A 292 (e.g., 00 or 11). When the two outputs of circuits 290 and 292 are different (e.g., 01 or 10), the output of XOR 330 is "1," thus indicating a difference between reference circuit A 290 and model under verification circuit A 292.

FIG. 4 also shows difference function area B 410, which includes reference circuit B 420 and model under verification circuit B 430, as well as XOR 340 shown in FIG. 3. Similar to XOR 330 discussed above, the output of XOR 340 will be "0" when the output of reference circuit B 420 is equal to the output of model under verification circuit B 430, otherwise XOR 340's output will be "1."

To check equivalence between analog outputs not feeding into the digital section reference models, XOR 350 compares the digitized analog outputs of analog section reference model 210 to that of analog section model under verification 240. As such, the combination of each of the XOR outputs (digital equivalence result 450) determines equivalency. If one of the XOR's generate a 1, digital equivalence result 450 does not reduce to zero and the hybrid mixed signal equivalence checking system executes further verification steps to determine equivalency (see FIGS. 5, 6 and corresponding text for further details).

FIG. 5 is a diagram depicting one example of a hybrid mixed signal equivalence checking system analyzing analog simulation results to verify equivalence between two models when a difference function's digital equivalence result does not reduce to zero. Hybrid mixed signal equivalence checking system 130 generates analog simulation results 500 while performing analog simulation. Analog simulation results 500 includes digitized analog output values 510 (values at the A/D interface cut points) for each analog assertion (assertions 1, 2, 3, and 4).

Similarly, hybrid mixed signal equivalence checking system 130 generates digital equivalency checking results while performing digital equivalence checking. When the difference function generates a non-zero result, such as non-zero digital equivalence result 530, hybrid mixed signal equivalence checking system 130 identifies the input assertions that generated the non-zero digital equivalence result. FIG. 5 shows that inputs 540 ("11") generated a non-zero digital equivalence result.

Hybrid mixed signal equivalence checking system 130 then determines whether the inputs generating the non-zero digital equivalence result are actually generated by the analog portion of the models (e.g., generated at the A/D interface cut points). FIG. 5 shows that the value of "11" is not included in output values 510 and, therefore, hybrid mixed signal equivalence checking system 130 ignores non-zero digital equivalence result 530 and determines equivalency accordingly (see FIG. 6 (665 and 670) and corresponding text for further details).

FIG. 6 is a flowchart depicting one example of steps taken to verify equivalence between a mixed signal reference model and a mixed signal model under verification. Processing commences at 600, whereupon the mixed signal equivalence checking system retrieves a mixed signal reference model and a mixed signal model under verification (605). For example, the mixed signal reference model may be an RTL model and the model under verification may be a schematic/transistor level model.

At, 610, the mixed signal equivalence checking system partitions both models into an analog section and a digital section. In one embodiment, the mixed signal equivalence checking system identifies a separation point by automatically determining the points where A/D converters are placed in the model. In another embodiment, a circuit designer may specify the cut-points for partitioning the designs into analog sections and digital sections via a design verification tool. The mixed signal equivalence checking system, at 615, inserts temporary analog/digital (A/D) converters in areas that have analog outputs that are not fed into an existing A/D converter. In turn, the hybrid mixed signal equivalence checking system establishes interface cut points in the reference model and the model under verification (e.g., interface cut points 278 and 288 shown in FIG. 2).

At 620, the mixed signal equivalence checking system simulates both analog sections (analog section reference model 210 and analog section model under verification 240) and compares the digitized analog output values at the interface cut points generated from the two analog sections. For example, the mixed signal equivalence checking system may perform SPICE simulations and capture the digitized analog output values accordingly.

The mixed signal equivalence checking system determines whether the digitized analog output values match at the interface cut points (decision 625). If the digitized analog outputs match, decision 625 branches to the "Yes" branch, whereupon the mixed signal equivalence checking system adds miter circuitry (XOR gates) and generates difference functions based upon circuit representations in the digital sections of the reference model and the model under verification (pre-defined process block 650, see FIG. 7 and corresponding text for further details).

The mixed signal equivalence checking system solves the difference functions using various known approaches such as SAT and/or binary decision diagrams at 655, and a determination is made as to whether the difference functions' digital equivalence results reduce to zero (decision 660). As those skilled in the art can appreciate, when the digital equivalence results reduce to zero, digital circuitry in the two different models are equivalent, whereas the digital circuitry in the two different models are different when the digital equivalence results equal 1. If the digital equivalence results reduce to zero, decision 660 branches to the "Yes" branch, whereupon the mixed signal equivalence checking system determines that the mixed signal reference model and the mixed signal model under verification are equivalent.

On the other hand, of the mixed signal equivalence checking system determines that the digital equivalence results do not reduce to zero, decision 660 branches to the "No" branch, whereupon the mixed signal equivalence checking system compares the input assertions generating the non-zero outcome results (inputs 540 shown in FIG. 5) against the produced digitized analog output values (during analog simulation) to determine whether the input assertions generating the outcome result of 1 could be generated. Referring to FIG. 5, although inputs 540 caused non-zero digital equivalence result 530, the value of inputs 540 (11) is not included in analog simulation results 510.

If the mixed signal equivalence checking system determines that the digitized analog output values do not generate the values that cause the difference function to equal 1, decision 670 branches to the "No" branch, whereupon the mixed signal equivalence checking system determines that the two models are equivalent (640). On the other hand, if the mixed signal equivalence checking system determines that the digitized analog output values generate values that cause the difference function to equal 1, decision 670 branches to the "Yes" branch, whereupon the mixed signal equivalence checking system determines that the two models are not equivalent (675) and processing ends at 680.

Referring back to decision 625, if the digitized analog output values do not match during the analog simulation, decision 625 branches to the "No" branch, whereupon the mixed signal equivalence checking system simulates the affected digital cone of logic corresponding to the mismatched outputs and compares digital output results of the models to check whether the mismatched outputs produce an overall difference in the model's output (e.g., the mismatched outputs are not a factor in final output values of the digital section) (630).

A determination is made as to whether the output results match (decision 635). If the outputs match, decision 635 branches to the "Yes" branch, whereupon the mixed signal equivalence checking system determines that the model under verification and the reference model are equivalent (640) and processing ends at 645. In one embodiment, the affected cone of logic simulation accounts for the digital section that receives the mismatched analog outputs as inputs. In this embodiment, difference functions may be used to calculate equivalence of the digital sections not included in the affected cone of logic.

On the other hand, if the outputs do not match, decision 635 branches to the "No" branch, whereupon the mixed signal equivalence checking system determines that the model under verification and the reference model are not equivalent (675), and processing ends at 680.

Figure 7:
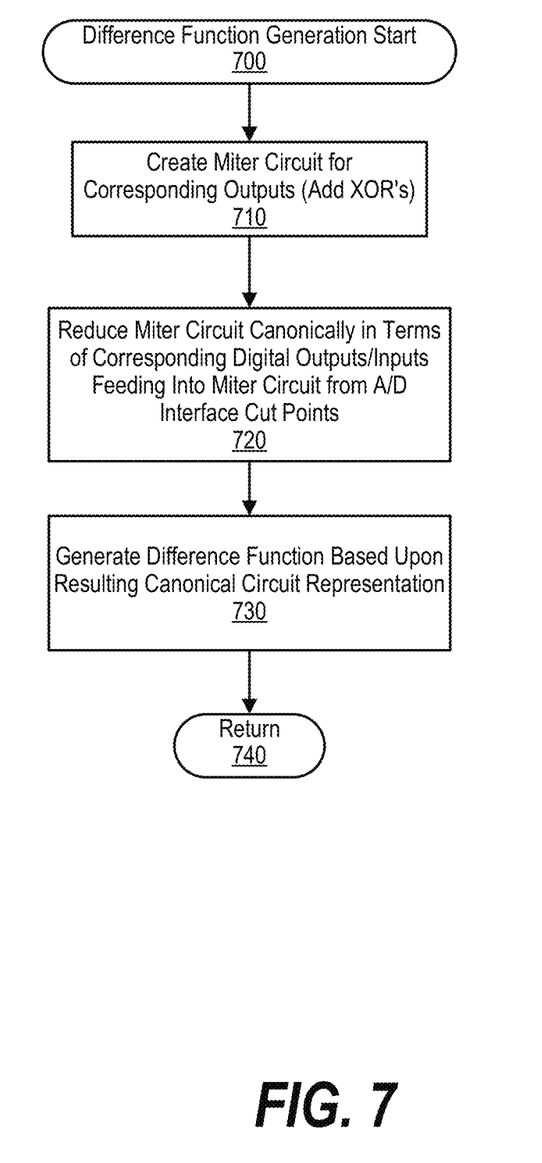
FIG. 7 is a flowchart showing one example of steps taken to generate difference functions used to verify digital equivalence between digital sections of a reference model and a model under verification.

FIG. 7 is a flowchart showing one example of steps taken to generate difference functions used to verify equivalence between digital sections of a reference model and a model under verification. Difference function generation commences at 700, whereupon the mixed signal equivalence checking system creates a miter circuit and connects the different digital models' corresponding outputs to the miter circuit. In one embodiment, the miter circuit includes exclusive OR (XOR) gates as shown in FIGS. 3 and 4.

At 720, the mixed signal equivalence checking system reduces the miter circuit canonically using, in one embodiment, Boolean satisfiability problem (SAT) techniques such as a binary decision diagram (BDD), which are common to those skilled in the art. Next, the mixed signal equivalence checking system generates a difference function based upon the resulting canonical circuit representation at 730, which is the reduced form of the canonical XOR logic. Processing returns at 740.

According to one embodiment of the present disclosure, an equivalence checking system generates a digital equivalence result by solving a difference function, which is based upon a first digital section included in a first mixed signal model and a second digital section included in a second mixed signal model. The equivalence checking system determines whether the first mixed signal model is equivalent to the second mixed signal model based upon the digital equivalence result and an analog equivalence verification between a first analog section included in the first mixed signal model and a second analog section included in the second mixed signal model. In turn, the equivalence checking system generates an equivalence notification based upon the determination.

According to another embodiment of the present disclosure, the equivalence checking system locates interface cut points (analog to digital transition areas) in the first mixed signal model and the second mixed signal model. The equivalence checking system, in turn, collects digitized analog output values at the interface cut points and determines that each of the digitized analog output values collected from the reference model match the digitized analog output values collected from the model under verification.

According to yet another embodiment of the present disclosure, the equivalence checking system determines that the difference function generates a non-equivalent outcome result based upon a set of non-reducing input values. As such, the equivalence checking system compares the set of non-reducing input values to the digitized analog output values from the reference model or the model under verification. In turn, the equivalence checking system determines that the first digital section is equivalent to the second digital section when the set of non-reducing input values fails to match the digitized analog output values.

According to yet another embodiment of the present disclosure, the equivalence checking system selects an analog signal in both of the mixed signal model that does not couple to one of the analog to digital signal conversions. In turn, the equivalence checking system adds an analog to digital converter to both mixed signal models that couple to the selected analog signal, which generates an additional digitized analog output value that the equivalence checking system adds to the interface cut points.

According to yet another embodiment of the present disclosure, the equivalence checking system generates the difference function by selecting a digital output from the reference model and selecting a corresponding digital output from the model under verification. The equivalence checking system creates a miter circuit that includes the selected digital outputs and, in turn, creates the difference function by canonically reducing the miter circuit based upon the digitized analog output values.

According to yet another embodiment of the present disclosure, the first mixed signal model is an RTL model and the second mixed signal model is a transistor level model, both of which corresponding to a same mixed signal design.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

As will be appreciated by one skilled in the art, aspects of the present disclosure may be embodied as a system, method or computer program product. Accordingly, aspects of the present disclosure may take the form of an entirely hardware embodiment, a software embodiment (including firmware, resident software, micro-code, etc.), including processing circuitry for executing thereof, or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program, in a non-transitory fashion, for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 8:
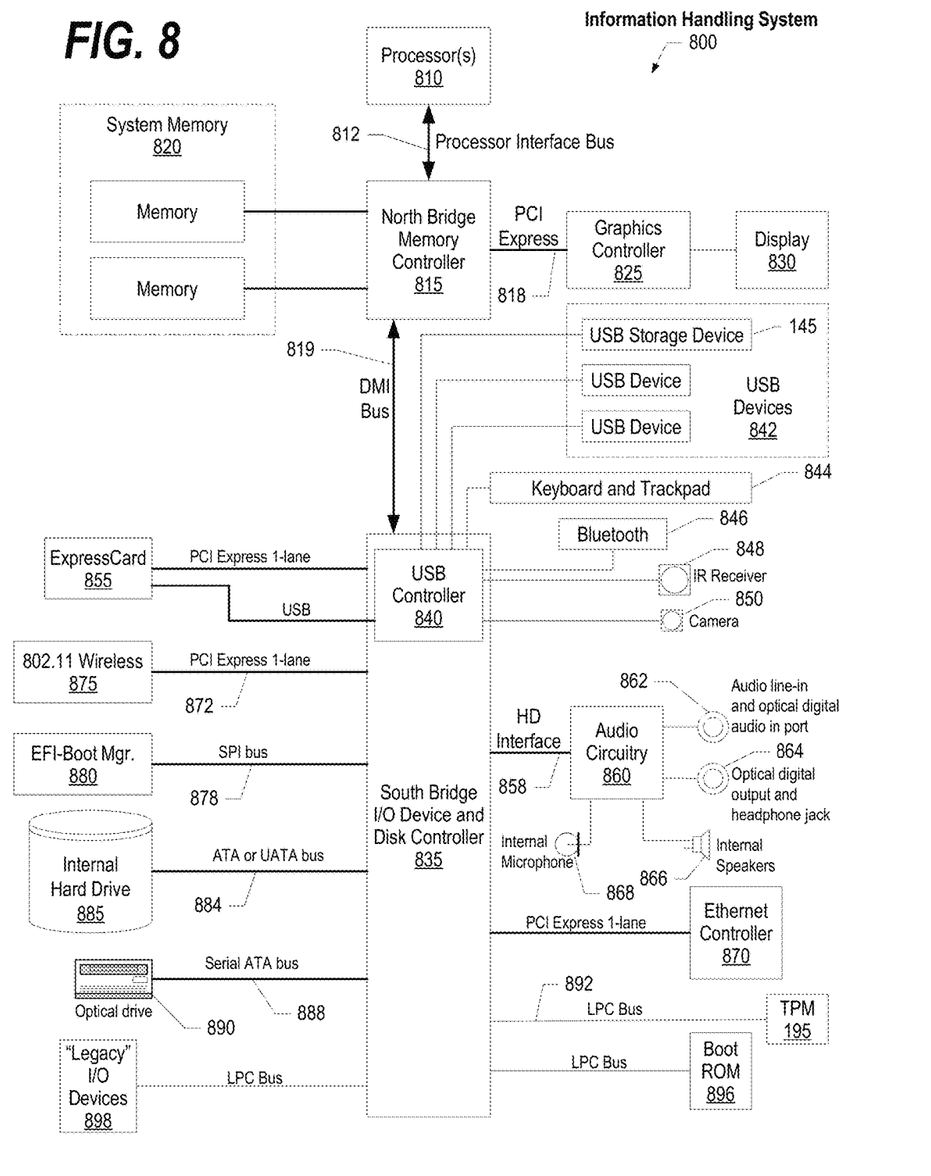
FIG. 8 illustrates a simplified example of a computer system capable of performing the computing operations described herein.

FIG. 8 illustrates information handling system 900, which is a simplified example of a computer system capable of performing the computing operations described herein. Information handling system 900 includes one or more processors 910 coupled to processor interface bus 912. Processor interface bus 912 connects processors 910 to Northbridge 915, which is also known as the Memory Controller Hub (MCH). Northbridge 915 connects to system memory 920 and provides a means for processor(s) 910 to access the system memory. Graphics controller 925 also connects to Northbridge 915. In one embodiment, PCI Express bus 918 connects Northbridge 915 to graphics controller 925. Graphics controller 925 connects to display device 930, such as a computer monitor.

Northbridge 915 and Southbridge 935 connect to each other using bus 919. In one embodiment, the bus is a Direct Media Interface (DMI) bus that transfers data at high speeds in each direction between Northbridge 915 and Southbridge 935. In another embodiment, a Peripheral Component Interconnect (PCI) bus connects the Northbridge and the Southbridge. Southbridge 935, also known as the I/O Controller Hub (ICH) is a chip that generally implements capabilities that operate at slower speeds than the capabilities provided by the Northbridge. Southbridge 935 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 996 and "legacy" I/O devices (using a "super I/O" chip). The "legacy" I/O devices (998) can include, for example, serial and parallel ports, keyboard, mouse, and/or a floppy disk controller. The LPC bus also connects Southbridge 935 to Trusted Platform Module (TPM) 995. Other components often included in Southbridge 935 include a Direct Memory Access (DMA) controller, a Programmable Interrupt Controller (PIC), and a storage device controller, which connects Southbridge 935 to nonvolatile storage device 985, such as a hard disk drive, using bus 984.

ExpressCard 955 is a slot that connects hot-pluggable devices to the information handling system. ExpressCard 955 supports both PCI Express and USB connectivity as it connects to Southbridge 935 using both the Universal Serial Bus (USB) the PCI Express bus. Southbridge 935 includes USB Controller 940 that provides USB connectivity to devices that connect to the USB. These devices include webcam (camera) 950, infrared (IR) receiver 948, keyboard and trackpad 944, and Bluetooth device 946, which provides for wireless personal area networks (PANs). USB Controller 940 also provides USB connectivity to other miscellaneous USB connected devices 942, such as a mouse, removable nonvolatile storage device 945, modems, network cards, ISDN connectors, fax, printers, USB hubs, and many other types of USB connected devices. While removable nonvolatile storage device 945 is shown as a USB-connected device, removable nonvolatile storage device 945 could be connected using a different interface, such as a Firewire interface, etcetera.

Wireless Local Area Network (LAN) device 975 connects to Southbridge 935 via the PCI or PCI Express bus 972. LAN device 975 typically implements one of the IEEE 802.11 standards of over-the-air modulation techniques that all use the same protocol to wireless communicate between information handling system 900 and another computer system or device. Optical storage device 990 connects to Southbridge 935 using Serial ATA (SATA) bus 988. Serial ATA adapters and devices communicate over a high-speed serial link. The Serial ATA bus also connects Southbridge 935 to other forms of storage devices, such as hard disk drives. Audio circuitry 960, such as a sound card, connects to Southbridge 935 via bus 958. Audio circuitry 960 also provides functionality such as audio line-in and optical digital audio in port 962, optical digital output and headphone jack 964, internal speakers 966, and internal microphone 968. Ethernet controller 970 connects to Southbridge 935 using a bus, such as the PCI or PCI Express bus. Ethernet controller 970 connects information handling system 900 to a computer network, such as a Local Area Network (LAN), the Internet, and other public and private computer networks.

While FIG. 8 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

While particular embodiments of the present disclosure have been shown and described, it will be obvious to those skilled in the art that, based upon the teachings herein, that changes and modifications may be made without departing from this disclosure and its broader aspects. Therefore, the appended claims are to encompass within their scope all such changes and modifications as are within the true spirit and scope of this disclosure. Furthermore, it is to be understood that the disclosure is solely defined by the appended claims. It will be understood by those with skill in the art that if a specific number of an introduced claim element is intended, such intent will be explicitly recited in the claim, and in the absence of such recitation no such limitation is present.

The invention claimed is:

1. A method comprising:
solving, by one or more processors included in an equivalence checking system, a difference function that is based upon a first digital section included in a first mixed signal model and a second digital section included in a second mixed signal model, the solving resulting in a digital equivalence result;
determining whether the first mixed signal model is equivalent to the second mixed signal model based upon the digital equivalence result and an analog equivalence verification between a first analog section included in the first mixed signal model and a second analog section included in the second mixed signal model; and
generating, by at least one of the one or more processors, an equivalence notification based upon the determination.

2. The method of claim 1 further comprising:
locating a first set of interface cut points in the first mixed signal model that correspond to one or more first analog to digital signal conversions in the first mixed signal model;
locating a second set of interface cut points in the second mixed signal model that correspond to one or more second analog to digital signal conversions in the second mixed signal model; and
collecting, during the analog equivalence verification, one or more first sets of digitized analog output values at the first set of interface cut points, and collecting one or more second sets of digitized analog output values at the second set of interface cut points.

3. The method of claim 2 wherein the analog equivalence verification further comprises:
determining that each of the one or more first sets of digitized analog output values match each of the corresponding one or more second sets of digitized analog output values.

4. The method of claim 2 wherein the one or more first sets of digitized analog output values are inputs to the first digital section, and wherein the one or more second sets of digitized analog output values are inputs to the second digital section.

5. The method of claim 4 further comprising:
determining that the difference function generates a non-equivalent outcome result based upon a set of non-reducing input values;
comparing the set of non-reducing input values to one of a selected one or more sets of digitized analog output values selected from the group consisting of the one or more first sets of digitized analog output values and the one or more second sets of digitized analog output values; and
determining that the first digital section is equivalent to the second digital section in response to determining that the set of non-reducing input values fails to match one of the selected one or more sets of digitized analog output values.

6. The method of claim 2 further comprising:
selecting a first analog signal in the first mixed signal model that fails to correspond to one of the analog to digital signal conversions;
adding a first analog to digital converter into the first mixed signal design that couples to the selected first analog signal, resulting in an additional first set of interface cut points that generate a portion of the collected one or more first sets of digitized analog output values;
selecting a second analog signal in the second mixed signal model that fails to correspond to one of the analog to digital signal conversions; and
adding a second analog to digital converter into the second mixed signal design that couples to the selected second analog signal, resulting in an additional second set of interface cut points that generate a portion of the collected one or more second sets of digitized analog output values.

7. The method of claim 6 wherein the added first analog to digital converter and the added second analog to digital converter are represented in the difference function.

8. The method of claim 1 further comprising:
generating the difference function, wherein the generation of the difference function further comprises:
selecting a first digital output from the first digital section and selecting a second digital output from the second digital section that corresponds to the first digital output;
creating a miter circuit that includes the first digital output and the second digital output; and
canonically reducing the miter circuit based upon one or more of the first sets of digitized analog output values, the canonical reduction resulting in the difference function.

9. The method of claim 1 wherein the first mixed signal model is an RTL model corresponding to a mixed signal design, and wherein the second mixed signal model is a transistor level model corresponding to the mixed signal design.

10. A system comprising:
equivalence checking circuitry configured to:
solve a difference function that is based upon a first digital section included in a first mixed signal model and a second digital section included in a second mixed signal model, the solving resulting in a digital equivalence result;
determine whether the first mixed signal model is equivalent to the second mixed signal model based upon the digital equivalence result and an analog equivalence verification between a first analog section included in the first mixed signal model and a second analog section included in the second mixed signal model; and generate an equivalence notification based upon the determination.

11. The system of claim 10 wherein the equivalence checking circuitry is further configured to:

locate a first set of interface cut points in the first mixed signal model that correspond to one or more first analog to digital signal conversions in the first mixed signal model;

locate a second set of interface cut points in the second mixed signal model that correspond to one or more second analog to digital signal conversions in the second mixed signal model; and collect, during the analog equivalence verification, one or more first sets of digitized analog output values at the first set of interface cut points, and collecting one or more second sets of digitized analog output values at the second set of interface cut points.

12. The system of claim 11 wherein the equivalence checking circuitry is further configured to:

determining that each of the one or more first sets of digitized analog output values match each of the corresponding one or more second sets of digitized analog output values.

13. The system of claim 11 wherein the one or more first sets of digitized analog output values are inputs to the first digital section, and wherein the one or more second sets of digitized analog output values are inputs to the second digital section, the equivalence checking circuitry further configured to:

determine that the difference function generates a non-equivalent outcome result based upon a set of non-reducing input values;

compare the set of non-reducing input values to one of a selected one or more sets of digitized analog output values selected from the group consisting of the one or more first sets of digitized analog output values and the one or more second sets of digitized analog output values; and determine that the first digital section is equivalent to the second digital section in response to determining that the set of non-reducing input values fails to match one of the selected one or more sets of digitized analog output values.

14. The system of claim 11 wherein the equivalence checking circuitry is further configured to:

select a first analog signal in the first mixed signal model that fails to correspond to one of the analog to digital signal conversions;

add a first analog to digital converter into the first mixed signal design that couples to the selected first analog signal, resulting in an additional first set of interface cut points that generate a portion of the collected one or more first sets of digitized analog output values;

select a second analog signal in the second mixed signal model that fails to correspond to one of the analog to digital signal conversions; and add a second analog to digital converter into the second mixed signal design that couples to the selected second analog signal, resulting in an additional second set of interface cut points that generate a portion of the collected one or more second sets of digitized analog output values.

15. The system of claim 10 wherein the equivalence checking circuitry is further configured to:

generate the difference function, wherein the generation of the difference function further comprises:

select a first digital output from the first digital section and selecting a second digital output from the second digital section that corresponds to the first digital output;

create a miter circuit that includes the first digital output and the second digital output; and canonically reduce the miter circuit based upon one or more of the first sets of digitized analog output values, the canonical reduction resulting in the difference function.

16. The system of claim 10 wherein the first mixed signal model is an RTL model corresponding to a mixed signal design, and wherein the second mixed signal model is a transistor level model corresponding to the mixed signal design.

17. A computer program product stored in a computer readable storage medium, comprising computer program code that, when executed by an information handling system, causes the information handling system to perform actions comprising:

solving a difference function that is based upon a first digital section included in a first mixed signal model and a second digital section included in a second mixed signal model, the solving resulting in a digital equivalence result;

determining whether the first mixed signal model is equivalent to the second mixed signal model based upon the digital equivalence result and an analog equivalence verification between a first analog section included in the first mixed signal model and a second analog section included in the second mixed signal model; and generating an equivalence notification based upon the determination.

18. The computer program product of claim 17 wherein the computer readable storage medium stores additional instructions that, when executed by the information handling system, cause the information handling system to perform additional actions comprising:

locating a first set of interface cut points in the first mixed signal model that correspond to one or more first analog to digital signal conversions in the first mixed signal model;

locating a second set of interface cut points in the second mixed signal model that correspond to one or more second analog to digital signal conversions in the second mixed signal model; and collecting, during the analog equivalence verification, one or more first sets of digitized analog output values at the first set of interface cut points, and collecting one or more second sets of digitized analog output values at the second set of interface cut points.

19. The computer program product of claim 18 wherein the computer readable storage medium stores additional instructions that, when executed by the information handling system, cause the information handling system to perform additional actions comprising:

determining that each of the one or more first sets of digitized analog output values match each of the corresponding one or more second sets of digitized analog output values.

20. The computer program product of claim 18 wherein the computer readable storage medium stores additional instructions that, when executed by the information handling system, cause the information handling system to perform additional actions comprising:
- selecting a first analog signal in the first mixed signal model that fails to correspond to one of the analog to digital signal conversions;
- adding a first analog to digital converter into the first mixed signal design that couples to the selected first analog signal, resulting in an additional first set of interface cut points that generate a portion of the collected one or more first sets of digitized analog output values;
- selecting a second analog signal in the second mixed signal model that fails to correspond to one of the analog to digital signal conversions; and
- adding a second analog to digital converter into the second mixed signal design that couples to the selected second analog signal, resulting in an additional second set of interface cut points that generate a portion of the collected one or more second sets of digitized analog output values.

\* \* \* \* \*